United States Patent [19]

Ebensberger et al.

[11] 4,203,068
[45] May 13, 1980

[54] VIBRATING COIL ASSEMBLY

[75] Inventors: Matthäus Ebensberger; Jürgen Hesse; Lothar Raab, all of Berlin, Fed. Rep. of Germany

[73] Assignee: Siemens Aktiengesellschaft, Munich, Fed. Rep. of Germany

[21] Appl. No.: 959,569

[22] Filed: Nov. 13, 1978

[30] Foreign Application Priority Data

Nov. 25, 1977 [DE] Fed. Rep. of Germany ....... 2753251

[51] Int. Cl.² .................... G01R 13/38; G01R 1/02
[52] U.S. Cl. ............................ 324/97; 324/154 R
[58] Field of Search ............ 324/97, 154 R, 150; 346/109

[56] References Cited

U.S. PATENT DOCUMENTS

| 2,519,689 | 8/1950 | Morrow | 324/97 |
| 3,119,963 | 1/1964 | Brikowski | 346/109 |
| 3,885,214 | 5/1975 | Kuligowski | 324/154 |

FOREIGN PATENT DOCUMENTS 2508055 10/1977 Fed. Rep. of Germany ........... 324/154

*Primary Examiner*—Rudolph V. Rolinec
*Assistant Examiner*—Ernest F. Karlsen
*Attorney, Agent, or Firm*—Kenyon & Kenyon

[57] ABSTRACT

A vibrating coil assembly for mirror galavanometers, light-beam oscillographs and the like having a mirror and a moving coil suspended by taut wires or ribbons. The ends of the wires nearest the moving coil are provided with eyes and a mounting wire is brought through the eyes and a window in the moving coil to form a figure 8 and clamp the moving coil within it. A stiffening tube for receiving the mirror is pushed over a section of the wire adjacent to one eye. The stiffening tube is cast together with the moving coil and the mounting wire by means of a setting compound.

2 Claims, 2 Drawing Figures

VIBRATING COIL ASSEMBLY

BACKGROUND OF THE INVENTION

This invention relates to a vibrating coil assembly for use in mirror galvanometers, light-beam oscillographs and the like having a moving coil suspended between two tension wires or ribbons, and a mirror. Such vibrating coil assemblies are used, for example, in light-beam oscillographs. There, the taut ribbons are fastened directly to the moving coil so that the tension they exert is transmitted directly to the moving coil. This brings about the danger of deforming the moving coil, which can lead to a degradation of the measuring properties of the vibrating coil assembly.

A vibrating coil assembly is described in German Pat. No. 2,508,055 in which the transmission of the tension force to the moving coil proper is avoided by the use of a support member for the moving coil, the ends of which are engaged by the taut wires. (German Pat. No. 2,508,055). This support member, which can consist, for instance, of a tube, and which has depressions transverse to the direction of rotation of the vibrating coil assembly, increases the inertial mass of the vibrating structure. Further, a weight distribution which is asymmetrical to the axis of rotation results, also leading to an increase in the moment of inertia. Overall, these effects serve to reduce the measuring sensitivity of the vibrating coil assembly. The depressions in the support members also result in an enlarged dimension of the vibrating coil assembly in a direction perpendicular to the axis of rotation and so require a larger total space.

German Pat. No. 2,242,957 discloses a vibrating coil assembly in which the moving coil is fastened at an angle to, and penetrated by, a single tension wire or a ribbon; here, too, no tension forces become effective at the moving coil. Because the position of the moving coil is asymmetrical to the axis of rotation, however, more space is, again, required and lower measuring sensitivity results.

It is an object of this invention to provide a vibrating coil assembly of the type mentioned above which, like the known vibrating coil assemblies with tension-relieved moving coils, is easy to install, but which requires less space and has a higher measuring sensitivity.

BRIEF DESCRIPTION OF THE INVENTION

According to the invention, this problem is solved by providing each of the ends of the taut suspending wires or ribbons nearest to the moving coil with an eye and by bringing a mounting wire forming a figure 8 through each eye and the open space or central window in the coil so that the moving coil is clamped within it. In this way, the tension force is carried by the figure 8 shaped mounting wire and is not transmitted to the moving coil. However, the effect of the tension is to cause the mounting wire to rest firmly on the each part of the moving coil it engages, and to clamp the moving coil on opposite sides so that its position is fixed in the plane defined by the figure 8 of the mounting wire. There is little freedom for the coil to move transversely to this plane because of the small clearance between the mounting wire and the window of the moving coil. An alignment by adjusting wedges can be made, however. If the moving coil is aligned symmetrically with respect to the mounting wire, it will also be so with respect to the axis of rotation of the vibrating coil assembly, since the eyes of the tension wires or taut ribbons are movable relative to the mounting wire and automatically take care of axial alignment under the influence of the tension force. If this alignment is accomplished in a different manner, the taut wires or taut ribbons may be connected directly, i.e., without the eyes, to the outer (as seen along the axis of rotation) ends of the mounting wire, for instance, by soldering.

The mirror can be cemented directly to the tension wire or ribbon. It is more advantageous, however, to push a stiffening tube for receiving the mirror over a section of the wire or ribbon adjacent to an eye and to cast-in the moving coil, together with the mounting wire and any stiffening tube in a setting compound. After setting, which must take place under tension aligned along the axis of rotation, the assembly of moving coil and mirror then forms a torsion-proof, rigid structure, which has an advantageous effect on the measuring accuracy. Also, once the position of the moving coil is fixed relative to the suspension wires or ribbons by the casting, it is not changed if the tension is relieved in the meantime.

All the masses of the vibrating coil assembly are arranged symmetrically relative to the axis of rotation. This by itself results in a smaller moment of inertia and a higher possible upper frequency limit of the vibrating coil assembly. The space required by this vibrating coil assembly depends essentially on the dimension of the moving coil in a direction perpendicular to the axis of rotation. The space required is obviously smaller than in the prior art vibrating coil assemblies having tension relieved moving coils. As it is usual for a number of such vibrating coil assemblies to be arranged in one housing in commercial equipments, significant space savings can be achieved by using the coil assembly of this invention.

DETAILED DESCRIPTION OF THE INVENTION

Figures 1, 2:
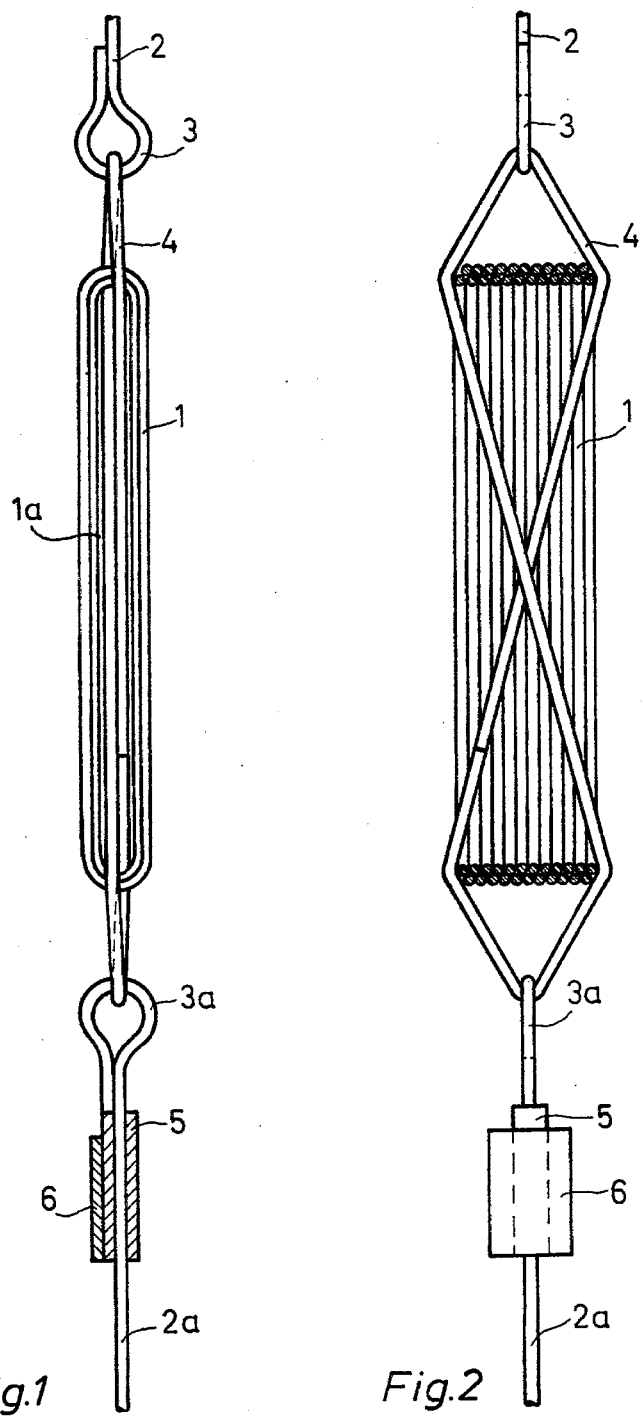
FIG. 1 is a side view of a moving coil and mirror constructed in accordance with the teachings of the inventor.
FIG. 2 is a front view of the moving coil assembly of FIG. 1.

FIG. 1 illustrates a moving coil 1 which may be wound of copper or of aluminum wire. Two taut suspension wires 2 and 2a are each provided, at their ends nearest the moving coil 1, with an eye or loop 3 and 3a. A mounting wire or ribbon 4 in the form of a figure 8 is passed through the two eyes and through the central window space 1a of the moving coil 1. The two ends of the mounting wire 4 can be connected to each other by soldering. This mounting wire 4 may be an enamel insulated copper wire if, for instance, the two suspension wires 2 and 2a are to serve as leads for making electrical connection to the moving coil 1. The mounting wire, however, may be of bare copper wire if, for instance, the taut wires themselves are insulated. The voltage leads of the moving coil 1 are then brought out in a manner well known in the art via separate lines. In the illustrative example, a stiffening tube 5, on which the mirror 6 is fastened, for instance, by cementing, is pushed over the suspension wire 2a.

The mounting wire 4 is brought through the eyes 3 and 3a and through the window 1a in the coil in such a way that end portions of the moving coil 1 are clamped inside the loops of the figure 8 formed by the mounting wire. To assemble this vibrating coil assemly, the suspension wires 2 and 2a, their eyes 3 and 3a, and the moving coil are aligned in a fixture which fixes their mutual position along the eventual axis of rotation of the vibrating coil assembly. Then the mounting wire 4 is pulled through the inserted parts to form the figure 8 and its ends are connected to each other, for instance, by soldering. In the case of an insulated mounting wire, the solder joint is advantageously placed in the coil window; in this way, double sided insulation is achieved if the taut wires are also insulated. Finally, the vibrating coil assembly can be cast in a casting resin, e.g., Araldit*, under pre-tension to ensure the alignment of the moving coil and the taut wire along the axis of rotation.

FIG. 2 shows the side view, turned 90°, of the same vibrating coil assembly as is shown in FIG. 1. For the sake of clarity, the individual wires of the moving coil 1 are shown. As can be seen in this figure, the mounting wire 4 encloses the moving coil 1 so tightly that its length is determined unequivocally.

What is claimed is:

1. In a vibrating coil assembly for mirror galvanometers, light-beam oscillographs and the like having a moving coil and a mirror wherein the coil is suspended between suspension elements formed of two tension wires or ribbons the improvement comprising:

the suspension elements having eyes at their ends nearest to the moving coil;

the moving coil being provided with a central window opening; and a mounting wire passing in a continuous loop successively through the eye of a first suspension element, through the coil window in a first direction from a first side of the coil to a second side of the coil, through the eye of a second suspension element, and through the coil window in a second direction from the second side of the coil to the first side of the coil to form a figure 8 with the moving coil clamped therein.

2. A vibrating coil assembly in accordance with claim 1 in which:

a stiffening tube for receiving the mirror is pushed over a section of the tension wire adjacent to one eye and, the moving coil, the mounting wire, and the stiffening tube are cast together in a setting compound.

* * * * *